(12) United States Patent
O'Handley et al.

(10) Patent No.: US 6,403,999 B1
(45) Date of Patent: Jun. 11, 2002

(54) DETECTION OF POLARIZED SPIN TRANSPORT IN SEMICONDUCTORS

(75) Inventors: Robert O'Handley, Andover, MA (US); Yi-Wun Li, Orinda, CA (US)

(73) Assignee: Spinix Corporation, Moraga, CA (US)

( * ) Notice: Subject to any disclaimer, the term of this patent is extended or adjusted under 35 U.S.C. 154(b) by 0 days.

(21) Appl. No.: 09/864,722

(22) Filed: May 23, 2001

Related U.S. Application Data

(60) Provisional application No. 60/207,044, filed on May 23, 2000.

(51) Int. Cl.[7] ............................................... H01L 26/76
(52) U.S. Cl. .................................. 257/295; 204/290.06
(58) Field of Search ........................... 257/295; 429/13, 429/10; 204/290.06; 438/14

(56) References Cited

U.S. PATENT DOCUMENTS

| | | | | |
|---|---|---|---|---|
| 5,652,445 A | * | 7/1997 | Johnson | 257/295 |
| 5,654,566 A | * | 8/1997 | Johnson | 257/295 |
| 5,817,221 A | * | 10/1998 | Leddy | 204/290.06 |
| 5,871,625 A | * | 2/1999 | Leddy | 204/290.06 |
| 5,928,804 A | * | 7/1999 | Leddy | 429/10 |
| 5,981,095 A | * | 11/1999 | Leddy | 429/13 |

* cited by examiner

*Primary Examiner*—John F. Niebling
*Assistant Examiner*—Andre' C Stevenson
(74) *Attorney, Agent, or Firm*—John Schipper

(57) ABSTRACT

Method and system for estimating a concentration of free electrons with a selected spin polarization in a semiconductor material. A static magnetic field and an electromagnetic field are impressed on the semiconductor, and free electrons are injected (through diffusion or tunneling) into the semiconductor material from a ferromagnetic material. Motion of the injected, spin-polarized electrons, within the semiconductor gives rise to a Hall voltage across the semiconductor. This voltage is measured at one or more spaced apart locations and analyzed to detect presence of, and estimate a concentration of, free electrons with a selected spin at at least one location within the semiconductor. Effects of an imposed stress, temperature, illumination or electromagnetic field on the semiconductor can be determined.

24 Claims, 4 Drawing Sheets

DETECTION OF POLARIZED SPIN TRANSPORT IN SEMICONDUCTORS

This application is based on a Provisional Application, No. 60/207,044, filed on May 23, 2000.

FIELD OF THE INVENTION

This invention relates to methods of detection and use of polarized spin transport in semiconductors and semiconductor devices.

BACKGROUND OF THE INVENTION

Semiconductor devices rely upon two different types of charge carriers, electrons and holes. The concentrations of these two types of carriers can be controlled by doping intrinsic semiconductors, such as silicon, germanium or gallium arsenide, with electron donors or electron acceptors. This doping creates n-type or p-type semiconductors that are the building blocks of diodes, transistors, photocells and many other high speed, compact integrated circuits used in information processing, logic, control and communications circuits. Semiconductor efficiency decreases below a certain device size, which depends upon (1) diffusion length that determines the depth of the doped layer, (2) the screening length that determines the distance over which a charge perturbation is neutralized, and (3) the small charge carrier concentrations in a semiconductor that lead to shot noise and reduced signal-to-noise ratios. The behavior of a metal is distinguishable from semiconductor behavior: a metal does not depend upon doping layers, has a much smaller screening length, has much larger charge carrier concentrations, and thus has a lower size limit than does a semiconductor.

In order to fabricate a metallic device that has the versatility of a semiconductor device, one needs an approach for distinguishing between two populations of charge carriers in a metallic device. In many ferromagnetic materials, including ferromagnetic metals, ferromagnetic oxides, some ferromagnetic-semiconductors and some insulators, charge transport occurs by two substantially independent channels, the spin-up channel and spin-down channel, each having different electrical conductivities. These two classes of conductivities can be modified independently, using alloying. New devices based on these two sets of charge carriers in magnetic metals have revolutionized the information storage industry in the early 1990s, through use of magnetoresistive read heads that are significantly more sensitive than, and smaller than, the preceding generations of inductive thin film read heads. This trend continues with the recent introduction of spin valve heads based on the giant magnetoresistive effect. Also, spin tunnel junctions, in which tunneling between two metal electrodes is different fro spin-up and spin-down electrons, are being developed for transducers and for magnetic random access memories.

Presently, some workers are focusing on means of fabricating ferromagnetic and semiconductor components for a new class of devices that combine the spins of a ferromagnetic metal, injected into a semiconductor, with many known functions of a semiconductor device.

What is needed is an approach for separately monitoring transport of electrons with polarized spins (up/down) that are injected into and tracked in a semiconductor material.

SUMMARY OF THE INVENTION

These needs are met by the invention, which provides a method for estimating the concentration of free electrons with a selected spin polarization in a semiconductor material. In one approach, a static magnetic field with a selected field strength is impressed on a semiconductor in a first selected direction on a semiconductor material. A selected time varying electromagnetic field (e.g., a microwave field) is impressed on the material in a direction transverse to the first selected direction. One or more spin-polarized free electrons from an adjacent ferromagnetic material (metal, oxide, semiconductor or other) is introduced into the semiconductor, and the magnetic moment is allowed to move under the influence of the magnetic field and electromagnetic field. A Hall voltage is measured in a second selected direction across the semiconductor at two or more selected, spaced apart locations in a direction parallel to the second selected direction. The measured Hall voltages are then analyzed to estimate the concentration of free electrons with a selected spin polarization within the semiconductor at one or more of the two or more selected locations. In some embodiments, an oxide film (non-magnetic or magnetic) is positioned between the ferromagnetic material and the semiconductor material.

DESCRIPTION OF THE INVENTION

The invention provides new methods for using coherent electron spins in ferromagnetic-semiconductor (F-S) structures to construct high speed integrated circuits, using phenomena observed separately in ferromagnetic materials and in semiconductors to probe or track the states of spin-polarized injected into semiconductors.

Figure 1:
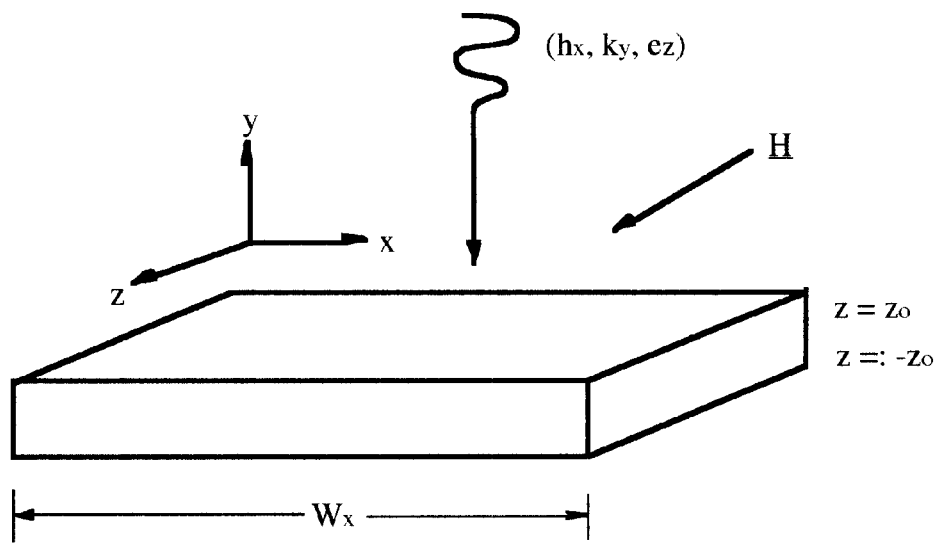
FIG. 1 illustrates a coordinate system adopted for discussion of the invention.

In certain thin film configurations, the presence of magnetic resonance is accompanied by generation of a measurable dc voltage across the film thickness. Assume that a static magnetic field $H_s$ is imposed in the z-coordinate direction, parallel to a thin film 11 that lies in an xz-plane and that is grounded at $z=\pm z_0$. Assume that an electromagnetic field $h_x, k_y, e_z$), such as a microwave field, is incident upon the thin film 11 in a direction transverse or approximately perpendicular to the static field direction, as illustrated in FIG. 1. The thin film has widths $\Delta x = w_x$ and $\Delta z = 2 \cdot z_0$ in the x- and z-directions, respectively. The accompanying time varying electrical field $e_z$ in the z-direction generates a current density $j_z$ in the film 11, with an amplitude that depends upon the film conductivity and upon the electrical field strength $e_z$ of the electromagnetic field. The accompanying magnetic field $h_x$ is in phase with the current density $j_z$. This magnetic field drives the net spin within the film, causing this net spin to precess about the direction of the static magnetic field $H_s$. At resonance, the transverse resonating component of spin lags the microwave magnetic field $k_y$ by 90°. At resonance, the y-component of the magnetic moment $m_y$ is a maximum when the current density $j_z$ is a maximum, and these two quantities change sign together. The spin-orbit interaction (L·S) provides a coupling of these two quantities through a spontaneous Hall effect $$E_H = R_s J \times M, \tag{1}$$

where $R_s$ is a spontaneous Hall effect coefficient (inversely proportion to film conductivity σ). For the coordinate system illustrated in FIG. 1, the spontaneous Hall electrical field is directed along the x-coordinate direction and has a magnitude of $$E_{Hall,x} = -R_s \cdot j_z \cdot m_y. \tag{2}$$

Because the sign of the product $j_z \cdot m_y$ does not change with time, a transverse dc voltage of magnitude $V_x = E_{Hall,x} \cdot w_x$ develops across the film, where $w_x$ is the film width in the x-direction. The incident electromagnetic field has a skin depth $$\delta_{skin} \approx \{c^2/2\pi\sigma\omega\}^{1/2} \text{ (in cgs units)}, \tag{3}$$

where c is velocity of light in the ambient medium. For a metal such as Cu, $\sigma \approx 64 \times 10^4$ (ohm-cm)$^{-1}$ and the skin depth is about 0.4 μm at an angular frequency of $2 \times 10^{11}$ radians/sec; the microwave field will extend through a thin film of thickness of the order of 0.2 μm or less. For a metal with much smaller conductivity σ, such as Gd, $\sigma \approx 0.73 \times 10^4$ (ohm-cm)$^{-1}$ and the skin depth is much larger, about 3.75 μm.

Figure 2:
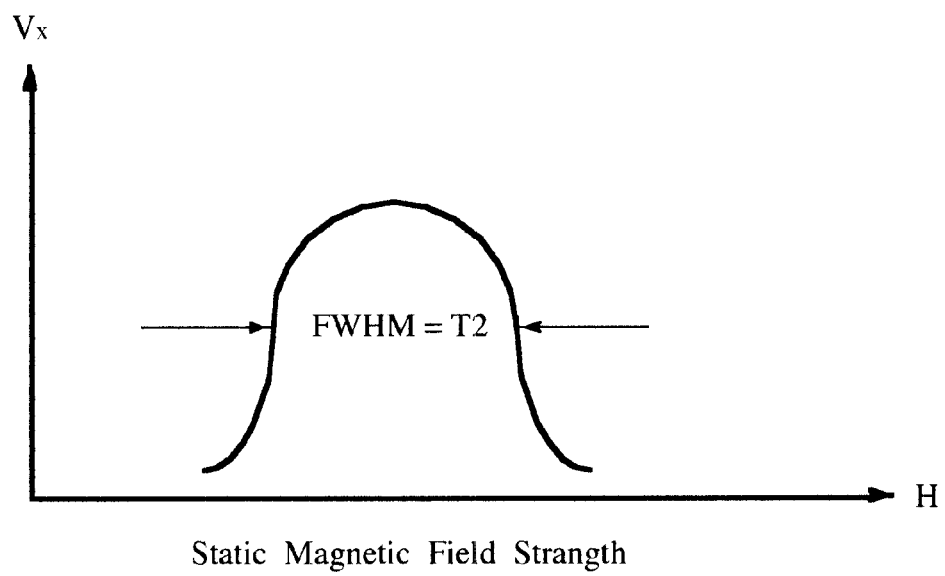
FIG. 2 is a graphical view of Hall effect dc voltage in Gd versus applied magnetic field strength.

The dc Hall voltage signal has a magnitude of tens of microvolts and can be detected readily as a function of field strength and temperature. This dc voltage signal is proportional to the net magnetization or spin polarization in the film, is inversely proportional to film conductivity σ, and manifests a resonance as a function of static magnetic field strength H. The resulting voltage $V_x$ also manifests a resonance as a function of the static magnetic field magnitude |H| and is illustrated in FIG. 2 for a gadolinium thin film (Gd: (Xe) 4f$^7$ 5d$^1$ 6s$^2$). The full width at half maximum (FWHM) of the resonance in FIG. 2 is controlled by the transverse spin-relaxation time T2. For Gd, a line width is of the order of 1000 Oe. The dc electrical field signal $E_y$ depends upon the spontaneous Hall coefficient $R_s$, which in turn depends upon the spin-orbit interaction and, therefore, upon the longitudinal spin relaxation time T1. In a semiconductor, the spontaneous Hall coefficient $R_s$ is much larger than the corresponding Hall coefficient for a metal, in part because $R_s$ increases with material resistivity ρ as a polynomial, $$R_s = a \cdot \rho + b \cdot \rho^2 + \tag{4}$$

Further, each of the spin relaxation times, T1 and T2, in a semiconductor is much smaller than the corresponding time in a metal.

The dc voltage signal $V_x$ for a semiconductor is of the order of hundreds of microvolts, for a thin film width $w_x$ in a range 0.1–10$^4$ μm, and appears as a resonance as a function of the static magnetic field strength H. This resonance is useful in probing and measuring the concentration of polarized electron spins in the semiconductor film. When spin-polarized electrons are injected from an F-layer (ferromagnetic material) into an S-layer (semiconductor material), the resonance in the S-layer has a very narrow line width, which allows detection of relatively small signals associated with these electrons.

This effect has been observed independently in ferromagnetic metals and in semiconductors and is observable for spin-polarized electrons injected from a ferromagnetic metal, ferromagnetic oxide, ferromagnetic semiconductor or other ferromagnetic material into a semiconductor material, including a ferromagnetic-semiconductor material such as $Sr_p(Fe_qMo_{1-q})O_r$. Electron injection can be implemented by tunneling through an oxide layer in an MOS structure, through direct transport driven by a bias voltage, or through thermal diffusion.

Figure 3A:
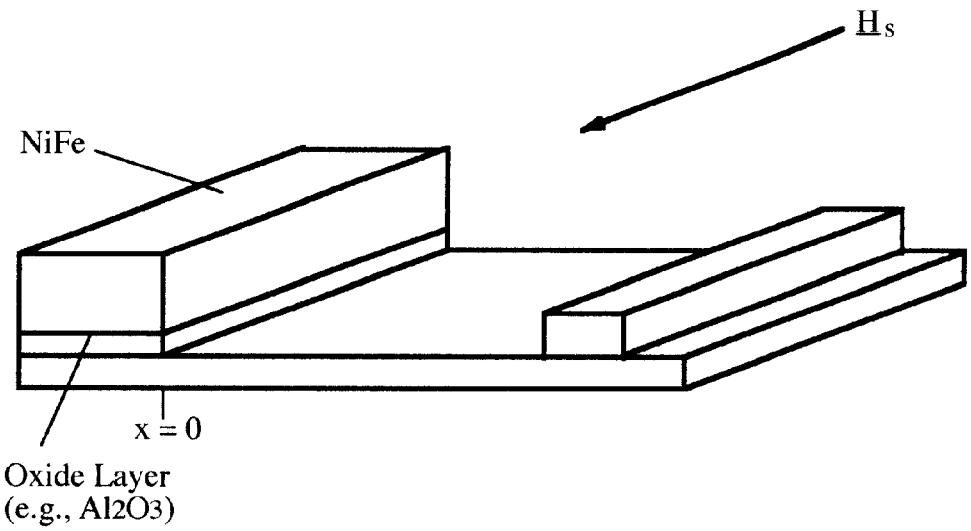
FIGS. 3A and 3B illustrate Hall effect electrical field in the ferromagnetic (F-) layer and semiconductor (S-) layer of a thin film device.
Figure 3B:
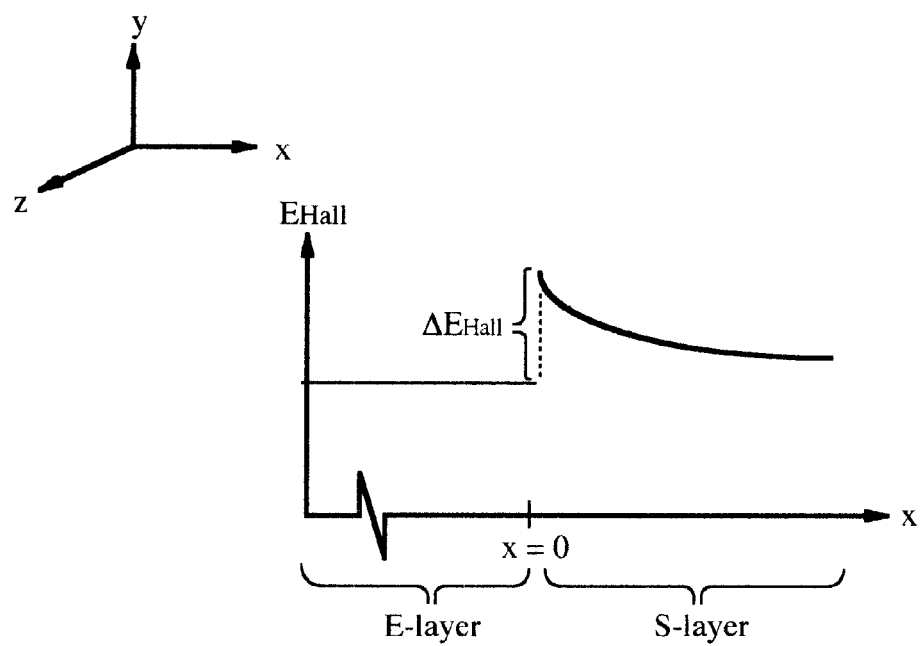

Once the spin-polarized electrons are injected into the semiconductor, the shorter spin relaxation time and larger spontaneous Hall coefficient $R_s$ of the semiconductor govern the dc signal generated across the semiconductor width. FIGS. 3A and 3B illustrate a situation where electron tunneling is employed. If the spin-polarized electrons tunnel from an F-layer into an S-layer (the respective regions x<0 and x>0 in FIG. 3B), an additional Hall electrical field $\Delta E_{Hall}$ will be generated in the semiconductor, near the F-S interface. The ferromagnetic material may be a metal, such as Fe, Ni, Co, NiFe, $Ni_pFe_qCo_r$, Gd, Tb, Dy, Ho, Er and/or Tm.; a magnetic oxide, such as $Ni_pFe_qCo_rO_s$, or another suitable ferromagnetic material. The insulation layer may be $Al_2O_3$, $Al_pO_qN_r$, $SiO_p$, $Si_pN_q$, EuO, EuS, $FeO_p$ and/or any other suitable insulator. The semiconductor material may be Ga, GaAs, GaP, Si, Ge, InSb, or GaMnN; a semiconductor doped with a magnetic material, such as with Mn; certain oxides, such as $ZnO_p$, $SnO_p$, $InO_p$ or $TiO_p$; a selected oxide doped with a magnetic material; and/or any other suitable semiconductor.

The spontaneous Hall voltage generated by injection of spin-polarized electrons into a semiconductor can be probed by a sequence of static electrodes at selected spaced apart locations in the x-coordinate direction. The diffusion length of spin-polarized electrons will be determined by a movable probe or by a decay length over which the dc voltage decreases to zero. At a given location, the resonance line widths T1 and T2, determine the spin lifetime(s); and transmission of the spin polarization across the interface determines the spin-polarized electron density.

If no spin-polarized electrons are injected from the F-layer into the S-layer, the open circuit dc voltage measured at any location (x) would be zero, unless the oxide layer is absent. With no oxide layer present and no injection, the semiconductor serves as an electrode for measuring the Hall effect dc voltage generated in the F-layer. If spin-polarized electrons, driven by a Hall voltage, diffuse into the S-layer in the x-direction, a location-dependent magnetization will arise there, given by $$m_{y,S}(x) = m_{y,F,0} \exp(-x/\delta), \tag{5}$$

where $m_{y,F,0}$ is the y-component of spin at the F-S interface and δ is the coherent spin diffusion length in the semiconductor. The phase of spin precession in the S-layer will often differ from the corresponding phase in the F-layer, because of the reduced magnetization density and the weaker damping mechanisms present in the S-layer. For example, line widths for spin-polarized electrons in InSb and in Ge are each about 1 Oe, which is a factor of about 1000 smaller than the corresponding line widths in a ferromagnetic metal, such as Fe.

The y-component of spin in the S-layer generates a spontaneous Hall effect voltage that is proportional to the electromagnetic field current density $j_{z,s}(x)$ and to the spontaneous Hall coefficient $R_s$ in that layer. Because $R_s$ is observed to vary with resistivity ρ approximately as $a \cdot \rho + b \cdot \rho^2$, the spontaneous Hall voltage in the S-layer is much smaller than the corresponding Hall voltage in the F-layer.

Figure 4:
FIG. 4 is a graphical view of Hall effect dc electrical in the F-layer and S-layer of a thin film device.

The open circuit dc voltage will vary in the S-layer as a function of the x-coordinate as indicated in FIG. 4 for the semiconductor region x>0, where the oxide layer is absent. The voltage $V_x$ will be used as a probe for the spin-polarized electrons in the S-layer.

Detection of an increase in dc voltage $V_x$ with distance from the F-S interface indicates diffusion of spin-polarized electrons into the semiconducting layer. The magnetic field strength at which the dc signal is most strongly observed in the S-layer may differ from the corresponding parameter value in the F-layer, because of the differing magnetizations, differing anisotropies and differing demagnetizing factors. As the magnetization decreases with increasing distance into the semiconducting layer, the resonance in that layer may occur at a continually decreasing magnetic field strength, which allows a further separation of the spin-dependent effects in the F-layer and S-layer. The much narrower resonance line width in the semiconductor will distinguish the resonance in the semiconductor from the resonance in the semiconductor.

The measured Hall voltage illustrated in FIG. 4 varies approximately with the coordinate x as $$V_X = V_X(F) \quad (x < 0) \tag{6}$$
$$= V_X(F) + \{V_X(S) - V_X(F)\}\exp(-\alpha x) \quad (x > 0)$$

where $1/\alpha = \delta$ is spin diffusion length in the semiconductor material. If the quantity $V_x$ (x>0) is measured at three or more spaced apart locations, x1, x2, x3 and x4, with $\Delta x = x3-x1 \neq 0$ and $x4-x3=x2-x1$, within the semiconductor, the parameters in Eq. (6) may be determined according to $$\alpha \cdot \Delta x = \ln\{VR(4;3;2;1)\}, \tag{7}$$

$$VR = VR(4;3;2;1) = \{V_x(x4) - V_x(x3)\}/\{V_x(x2) - V_x(x1)\}, \tag{8}$$

$$V_x(S) - V_x(F) = \{V_x(x2) - V_x(x1)\}/\{(VR)^{x1/(x3-x1)} - (VR)^{x2/(x3-x1)}\}, \tag{9}$$

$$V_x(F) = V_{x1} - \{V_x(S) - V_x(F)\} \exp(-\alpha x1). \tag{10}$$

Values of the parameters $\alpha$, $V_x(S)-V_x(F)$ and $V_x(F)$ may be estimated using Eqs. (6)–(10). If one of these parameters, such as $V_x(F)$ or $V_x(S)$, is already known, the remaining parameters may be estimated using measurements of Hall voltage $V_x$ at two spaced apart locations. The exponential parameter $\alpha$ characterizes variation of the free electron concentration within the semiconductor, and the voltage difference $V_x(S)-V_x(F)$ provides an estimate of voltage mismatch between semiconductor and ferromagnetic material at their common interface.

Figure 5:
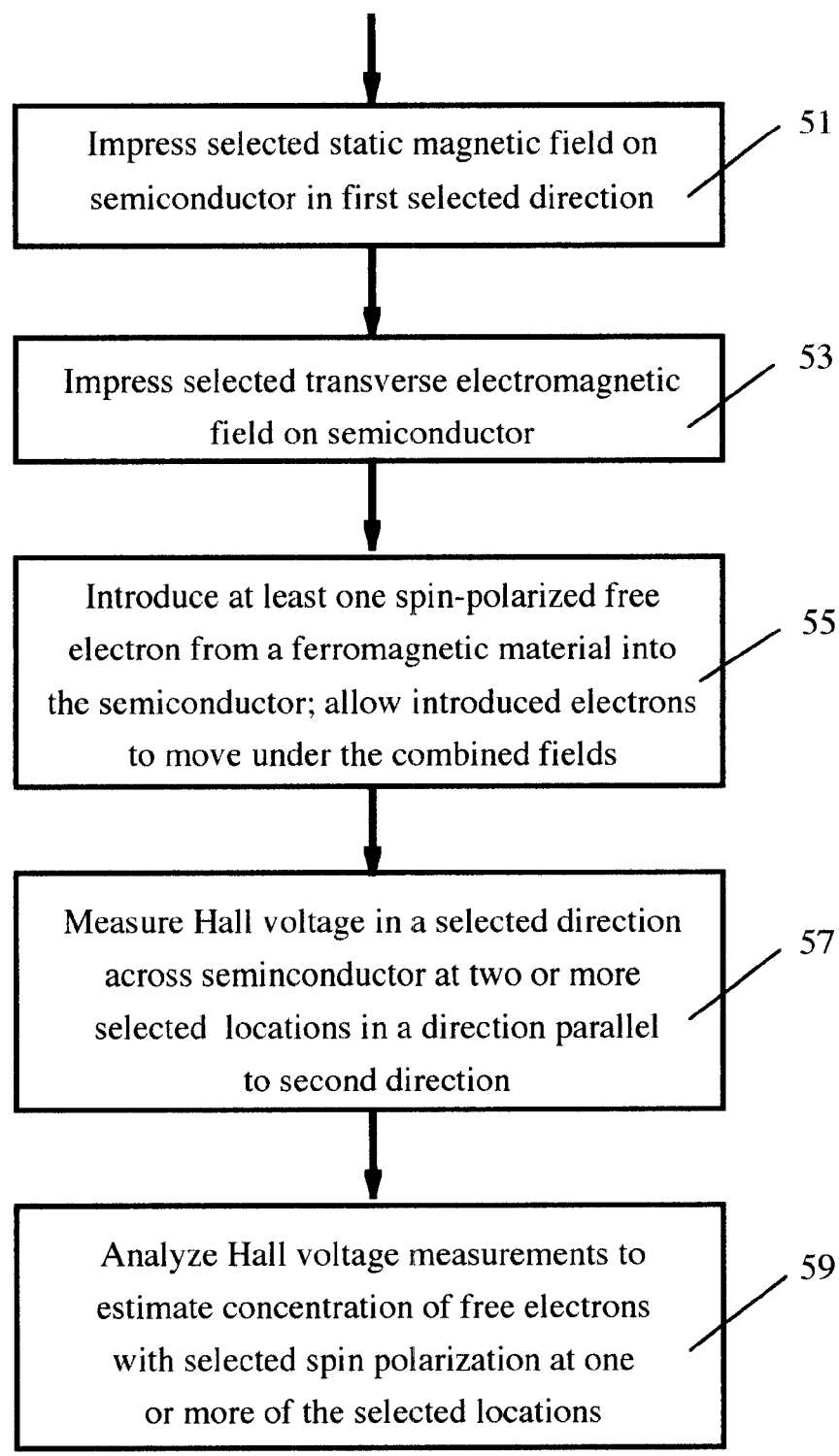
FIG. 5 is a flow chart of a method for practicing the invention.

FIG. 5 is a flow chart illustrating one procedure for practicing the invention. A static magnetic field is impressed on a semiconductor in a first selected direction, in step 51. A selected electromagnetic field (e.g., a microwave field), transverse or approximately perpendicular to the static magnetic field, is impressed on the semiconductor, in step 53. One or more spin-polarized electrons is injected from a ferromagnetic material into the semiconductor and moves under the combined influence of the static magnetic field and the electromagnetic field, in step 55. A Hall voltage develops from motion of the injected electrons, having an amplitude that may depend upon the direction of polarization of the free electron spin. A Hall voltage is measured in a second selected direction across the semiconductor, at at least two spaced apart locations in a direction that is parallel to the second direction, in step 57. The Hall voltage measurements are analyzed, and an estimate is made of the concentration of free electrons having a selected spin polarization within the semiconductor at at least one of the at least two selected locations, in step 59.

Figure 6A:
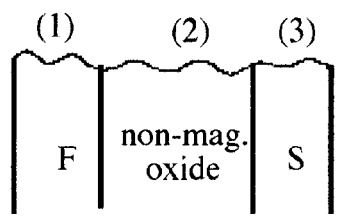
FIGS. 6A, 6B, 6C, 6D and 6E illustrate suitable two-layer and three-layer configurations for injecting spin-polarized electrons.
Figure 6B:
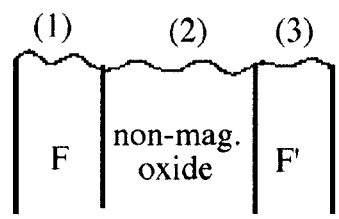
Figure 6C:
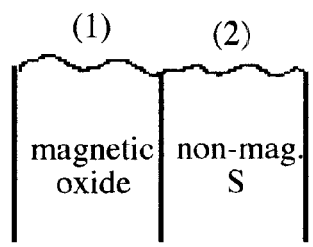
Figure 6D:
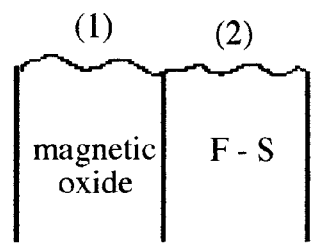
Figure 6E:
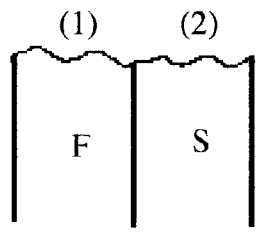

Injection or other introduction of spin-polarized electrons from a first (source) material to a second (destination) material can occur by diffusion, relying on a concentration gradient to provide the transport. Alternatively, an oxide interface, having a film thickness in a range 10–100 Å, and preferably in a range 10–20 Å, can be provided between the first and second materials to enhance tunneling of the spin-polarized electrons, with spin preservation. FIGS. 6A, 6B, 6C, 6D and 6E illustrate several three-layer and two-layer configurations that can be used to enhance spin-polarized electron tunneling from a source layer to a destination layer. In FIG. 6A, electrons are transmitted from a ferromagnetic layer (1) across a non-magnetic oxide film (2) to a semiconductor layer (3). In FIG. 6B, electrons are transmitted from a ferromagnetic layer (1) across a non-magnetic oxide film (2) to a ferromagnetic-semiconductor layer (3). In FIG. 6C, electrons are transmitted across a magnetic oxide film (1) to a non-magnetic semiconductor layer (1). In FIG. 6D, electrons are transmitted across a magnetic oxide film (1) to a ferromagnetic-semiconductor layer (2). In FIG. 6E, electrons are transmitted from a ferromagnetic layer (1) directly to a semiconductor layer (2).

The relatively large spontaneous Hall effect in semiconductors may also be exploited using a dc electrical field (constant or gradient) rather than a microwave field.

In a first class of Hall effect devices, spin-polarized electrons are injected into a semiconductor from a ferromagnetic metal or other material with a static magnetic field imposed, by direct injection or by tunneling from the F-layer into the S-layer. In this device, a bias voltage is imposed between the F-layer and S-layer, a static magnetic field is imposed perpendicular to the current in the S-layer and perpendicular to the direction of sensed voltage across the S-layer, and a static magnetic field is imposed with strength sufficient to magnetize most or all of the F-layers into a single domain state. One static magnetic field with a selected orientation may suffice here.

In a second class of Hall effect devices, a dc voltage arises across a semiconductor layer from ferromagnetic resonance of its own spin-polarized electrons. The dc voltage will vary with applied electrical field strength, applied magnetic field strength, applied stress and/or applied temperature; spin polarizations of the valence electrons are altered. This class of devices may serve as sensors of light (infrared, visible, etc.), heat, mechanical or electromechanical stress, electrical and/or magnetic fields. Resonance of the spin-polarized electrons in the semiconductor layer can be achieved by impressing an electromagnetic field from a remote field source, or from an integrated high frequency signal generator on an adjacent chip, or from passage of dc current through a magnetic multilayer.

In a third class of Hall effect devices, a dc voltage arises from a ferromagnetic resonance of spin-polarized electrons injected from a ferromagnetic layer, either directly or by tunneling through an oxide layer. The dc voltage will change as the F electrode is affected by an applied magnetic field, by a stress field and/or by an imposed temperature field, where the spin polarization of the semiconductor valence electrons is altered. This class of devices an serve as sensors of magnetic fields and stress fields and as logic functions and switches. Resonance of the spins in the semiconductor layer can be achieved using an incident microwave field.

These approaches can be used to estimate differences in free electron concentration in a semiconductor in the presence of absence of, with and without a stress field, a temperature field, an illumination field and/or a second electromagnetic field present imposed on the semiconductor material. For example, variation of the imposed field with a selected location coordinate, such as x, may cause the location-dependent magnetization within the semiconductor to vary in a manner other than that predicted by Eq. (5) for a uniform field. The coherent spin diffusion length $\delta$ in Eq. (5) may vary from its zero-field value, even where a uniform stress field, temperature field, illumination field and/or (second) electromagnetic field is imposed.

What is claimed is:

1. A method for estimating concentration of free electrons with a selected spin polarization in a semiconductor material, the method comprising:
   positioning a ferromagnetic material adjacent to a semiconductor material at an interface;
   impressing a static magnetic field with a selected field strength on the semiconductor material in a first selected direction;
   impressing a selected electromagnetic field, in a direction transverse to the first direction, on the semiconductor;
   injecting at least one spin-polarized free electron from the ferromagnetic material into the semiconductor, and allowing the at least one electron to move under the influence of the magnetic field and the electromagnetic field;
   measuring a Hall voltage in a second selected direction across the semiconductor at at least two selected spaced apart locations in a direction transverse to the second selected direction; and
   analyzing the Hall voltage measurements to estimate a concentration of free electrons with a selected spin polarization within the semiconductor at at least one of the at least two selected locations.

2. The method of claim 1, further comprising choosing said first and second selected directions to be transverse to each other.

3. The method of claim 1, further comprising choosing said first direction transverse to said second selected direction to be approximately parallel to said first selected direction.

4. The method of claim 1, further comprising:
   providing said semiconductor as a thin film having a thin film plane;
   choosing said first and second selected directions to be transverse to each other within the thin film plane.

5. The method of claim 1, further comprising choosing said semiconductor material from a group of semiconductor materials consisting of Ga, GaP, GaAs, InSb, Si, Ge, GaMnN and $Sr_p(Fe_qMo_{1-q})O_r$, where p, q and r are selected indices.

6. The method of claim 1, further comprising choosing said semiconductor material from a group of semiconductor materials consisting of Ga, GaP, GaAs, InSb, Si, Ge and GaMnN, doped with a selected magnetic material.

7. The method of claim 1, further comprising choosing said semiconductor material from a group of semiconductor materials consisting of $ZnO_p$, $SnO_q$, $InO_r$ and $TiO_s$, where p, q, r and s are selected indices.

8. The method of claim 1, further comprising choosing said ferromagnetic material from a group of ferromagnetic materials consisting of Fe, Ni, Co, NiFe, NiCo, FeCo, $Fe_pNi_qCo_r$, Gd, Tb, Gy, Ho, Er and Tm, where p, q and r are selected indices.

9. The method of claim 1, further comprising choosing said ferromagnetic material from a group of ferromagnetic materials consisting of oxides of Fe, Ni, Co, NiFe, NiCo, FeCo, $Fe_pNi_qCo_r$, Gd, Tb, Gy, Ho, Er and Tm, where p, q and r are selected indices.

10. The method of claim 1, further comprising positioning an oxide layer between said semiconductor material and said ferromagnetic material.

11. The method of claim 10, further comprising choosing said insulating material from a group of insulating materials consisting of $Al_2O_3$, $Al_pO_qN_r$, $SiO_p$, $Si_pN_q$, $FeO_p$, EuO and EuS, where p, q and r are selected indices.

12. The method of claim 1, further comprising providing said electromagnetic field as a microwave field having at least one frequency in a selected range of frequencies.

13. The method of claim 1, further comprising measuring said Hall voltage in said second selected direction across said semiconductor at at least three selected spaced apart locations in a direction transverse to said second selected direction.

14. The method of claim 1, wherein said process of analyzing said Hall voltage measurements comprises:
   measuring a first voltage difference between a voltage at first and second selected locations within said semiconductor;
   measuring a second voltage difference between a voltage at third and fourth selected locations within said semiconductor, where at least three of the first, second, third and fourth locations differ from each other;
   forming a ratio of the first and second voltage differences, and determining an exponential parameter that characterizes variation of said concentration of free electrons within said semiconductor; and
   using at least one of the first and second voltage differences and the exponential parameter to estimate said concentration of free electrons near said interface within said semiconductor.

15. The method of claim 14, further comprising choosing said first, second, third and fourth locations within said semiconductor to have location coordinates x1, x2, x3 and x4, respectively, measured in a direction transverse to said interface, where the coordinates satisfy the relations x2−x1=x4−x3 and x2=x3.

16. The method of claim 1, wherein said process of analyzing said Hall voltage measurements comprises:
   providing a first voltage difference, $V_x(x2)-V_x(x1)$, and a second voltage difference, $V_x(x4)-V_x(x3)$, measured at at least distinct three location coordinates, x1, x2, x3 and x4 measured in a selected direction, within said semiconductor, where $\Delta x=x3-x1$ is non-zero and the location coordinates satisfy x4=x3=x2−x1;
   computing a voltage difference ratio $VR=\{V_x(x4)-V_x(x3)\}/\{V_x(x2)-V_x(x1)\}$;
   computing a parameter $\alpha=(1/\Delta x)\cdot\ln\{VR\}$; and
   estimating said concentration of free electrons with a selected spin polarization within said semiconductor according to a relation $$V_x(x)=V_x(F)+(V_x(S)-V_x(F))\{1-\exp(-\alpha x)\},$$

where $V_x(F)$ and $V_x(S)$ are estimated voltages adjacent to said interface within said ferromagnetic material and said semiconductor material.

17. The method of claim 16, further comprising estimating said difference $V_x(S)-V_x(F)$ according to a relation $$V_x(S)-V_x(F)=\{V_x(x2)-V_x(x1)\}/\{(VR)^{x1/(x3-x1)}-(VR)^{x2/(x3-x1)}\}.$$

18. The method of claim 1, further comprising:

imposing a selected stress field on said semiconductor; and determining at least one difference of said concentration of free electrons, with the imposed stress field present and with the imposed stress field absent, at at least one location within said semiconductor.

19. The method of claim 1, further comprising:

imposing a selected temperature field on said semiconductor; and determining at least one difference of said concentration of free electrons, with the imposed temperature field present and with the imposed temperature field absent, at at least one location within said semiconductor.

20. The method of claim 1, further comprising:

imposing a selected illumination field on said semiconductor; and determining at least one difference of said concentration of free electrons, with the imposed illumination field present and with the imposed illumination field absent, at at least one location within said semiconductor.

21. The method of claim 1, further comprising:

imposing a second electromagnetic field on said semiconductor; and determining at least one difference of said concentration of free electrons, with the imposed second electromagnetic field present and with the imposed second electromagnetic field absent, at at least one location within said semiconductor.

22. A method for estimating concentration of free electrons with a selected spin polarization in a semiconductor material, the method comprising:

positioning an oxide material, having a selected thin film thickness, between, and contiguous to, a source material for spin-polarized free electrons and a destination material for the spin-polarized free electrons, where the source material, the oxide material and the destination material are a set of selected materials;

impressing a static magnetic field with a selected field strength on the destination material in a first selected direction;

impressing a selected electromagnetic field, in a direction transverse to the first direction, on the destination material;

injecting at least one spin-polarized free electron from the source material into the destination material, and allowing the at least one electron to move under the influence of the magnetic field and the electromagnetic field;

measuring a Hall voltage in a second selected direction across the destination material at at least two selected spaced apart locations in a direction transverse to the second selected direction; and analyzing the Hall voltage measurements to estimate a concentration of free electrons with a selected spin polarization within the destination material at at least one of the at least two selected locations.

23. The method of claim 22, further comprising choosing said set of said source material, said oxide material and said destination material from the sets consisting of: a ferromagnetic material, a non-magnetic oxide material and a non-magnetic semiconductor material; and a ferromagnetic material, a non-magnetic oxide material and a ferromagnetic-semiconductor material.

24. The method of claim 22, further comprising choosing said thin film thickness to be in a range 10 Å–100 Å.

* * * * *